(12) United States Patent
Takata

(10) Patent No.: US 10,236,861 B2
(45) Date of Patent: Mar. 19, 2019

(54) LADDER FILTER AND DUPLEXER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/710,857

(22) Filed: Sep. 21, 2017

(65) Prior Publication Data

US 2018/0013405 A1   Jan. 11, 2018

Related U.S. Application Data

(63) Continuation of application No. PCT/JP2016/057414, filed on Mar. 9, 2016.

(30) Foreign Application Priority Data

Apr. 30, 2015   (JP) ................. 2015-092801

(51) Int. Cl.
*H03H 9/72* (2006.01)
*H03H 9/64* (2006.01)

(52) U.S. Cl.
CPC ........ *H03H 9/6483* (2013.01); *H03H 9/6423* (2013.01); *H03H 9/725* (2013.01)

(58) Field of Classification Search
CPC ...... H03H 9/64; H03H 9/6406; H03H 9/6423; H03H 9/6483; H03H 9/6489; H03H 9/725
USPC .......................................... 333/133, 193–195
See application file for complete search history.

(56) References Cited

U.S. PATENT DOCUMENTS 8,269,577 B2 * 9/2012 Inoue ................ H03H 9/547
333/133
8,751,993 B1 * 6/2014 Fenzi ................ G06F 17/5045
716/122
2003/0227358 A1 * 12/2003 Inose ................ H03H 9/6423
333/193

(Continued)

FOREIGN PATENT DOCUMENTS

JP   06-061783 A  *  3/1994
JP   09-135145 A  *  5/1997

(Continued)

OTHER PUBLICATIONS

Official Communication issued in International Patent Application No. PCT/JP2016/057414, dated May 31, 2016.

*Primary Examiner* — Barbara Summons
(74) *Attorney, Agent, or Firm* — Keating & Bennett, LLP

(57) ABSTRACT

A ladder filter in which the pass band is defined by serial arm resonators and first and second parallel arm resonators includes the serial arm resonators, the first and second parallel arm resonators, and a third parallel arm resonator. The third parallel arm resonator is connected in parallel to the first parallel arm resonator, the electrostatic capacitance of the third parallel arm resonator is smaller than that of the first parallel arm resonator, and the anti-resonant frequency of the third parallel arm resonator is positioned outside the pass band of the ladder filter. The anti-resonant frequency of the first parallel arm resonator is positioned at the high frequency side of the anti-resonant frequencies of the second parallel arm resonators.

16 Claims, 13 Drawing Sheets

(56) References Cited

U.S. PATENT DOCUMENTS

| | | |
|---|---|---|
| 2005/0025324 A1 | 2/2005 | Takata |
| 2014/0197903 A1* | 7/2014 | Uesaka .................. H03H 9/725 |
| | | 333/132 |
| 2014/0218129 A1 | 8/2014 | Fujiwara et al. |
| 2014/0266510 A1* | 9/2014 | Silver .................... H03H 9/465 |
| | | 333/186 |
| 2017/0126204 A1 | 5/2017 | Takamine |

FOREIGN PATENT DOCUMENTS

| | | |
|---|---|---|
| JP | 2005-045475 A | 2/2005 |
| WO | 2016/031391 A1 | 3/2013 |
| WO | 2013/080461 A1 | 6/2013 |

* cited by examiner

LADDER FILTER AND DUPLEXER

CROSS REFERENCE TO RELATED APPLICATIONS

This application claims the benefit of priority to Japanese Patent Application No. 2015-092801 filed on Apr. 30, 2015 and is a Continuation Application of PCT Application No. PCT/JP2016/057414 filed on Mar. 9, 2016. The entire contents of each application are hereby incorporated herein by reference.

BACKGROUND OF THE INVENTION

1. Field of the Invention

The present invention relates to a ladder filter and a duplexer.

2. Description of the Related Art

Ladder filters have been widely used in cellular phones and other suitable devices.

International Publication No. 2013/080461 discloses an example of a ladder filter. This ladder filter includes multiple serial arm resonators and multiple first parallel arm resonators, which compose a pass band. The ladder filter also includes a second parallel arm resonator having a resonant frequency that is positioned at the high frequency side of the anti-resonant frequency of the multiple serial arm resonators. The second parallel arm resonator is connected in parallel to a parallel arm resonator that is not positioned closest to the input end and that is not positioned closest to the output end, among the multiple first parallel arm resonators.

The second parallel arm resonator is of a capacitive type within the pass band of the ladder filter. Accordingly, impedance matching is degraded and insertion loss is increased.

In addition, when the anti-resonant frequency of the first parallel arm resonators connected in parallel to the second parallel arm resonator is low, the capacitive frequency range is widened in the pass band. Accordingly, the ladder filter has large insertion loss even when the electrostatic capacitance of the second parallel arm resonator is decreased.

SUMMARY OF THE INVENTION

Preferred embodiments of the present invention provide ladder filters and duplexers capable of improving out-of-band attenuation, achieving outstanding impedance matching, and reducing the insertion loss.

A preferred embodiment of the present invention provides a ladder filter that has a certain pass band and that includes at least one serial arm resonator and first and second parallel arm resonators. The resonant frequency of the serial arm resonator and the anti-resonant frequencies of the first and second parallel arm resonators are positioned in the certain pass band. The anti-resonant frequency of the first parallel arm resonator is positioned at the high frequency side of the anti-resonant frequency of the second parallel arm resonator. The ladder filter further includes a third parallel arm resonator that is connected in parallel to the first parallel arm resonator, that has an electrostatic capacitance that is smaller than that of the first parallel arm resonator, and that has an anti-resonant frequency positioned outside of the certain pass band.

In a ladder filter according to a preferred embodiment of the present invention, the anti-resonant frequency of the first parallel arm resonator is preferably positioned at the high frequency side of the resonant frequency of the at least one serial arm resonator directly connected to the first parallel arm resonator without any serial arm resonator interposed therebetween. In this case, the frequency range from the anti-resonant frequency of the first parallel arm resonator to the resonant frequencies of the serial arm resonators is narrowed. This narrows the capacitive frequency range. Accordingly, significantly improved impedance matching is achieved.

In a ladder filter according to another preferred embodiment of the present invention, the second parallel arm resonator preferably includes multiple second parallel arm resonators and the ladder filter includes an input end and an output end. Among the first to third parallel arm resonators, two parallel arm resonators in the multiple second parallel arm resonators are the parallel arm resonator positioned closest to the input end and the parallel arm resonator positioned closest to the output end. In this case, the movement of the impedance in the pass band to the capacitive type is unlikely to occur at the input end side and the output end side. Accordingly, further improved impedance matching is achieved.

In a ladder filter according to another preferred embodiment of the present invention, the electrostatic capacitance of the third parallel arm resonator is preferably smaller than the electrostatic capacitances of the first and second parallel arm resonators. In this case, the ladder filter is reduced in size.

In a ladder filter according to another preferred embodiment of the present invention, the anti-resonant frequency of the third parallel arm resonator is preferably positioned at the high frequency side of the pass band, which includes the serial arm resonator and the first and second parallel arm resonators. In this case, the attenuation at the high frequency side of the pass band is increased.

In a ladder filter according to another preferred embodiment of the present invention, the anti-resonant frequency of the third parallel arm resonator is preferably positioned at the low frequency side of the pass band, which includes the serial arm resonator and the first and second parallel arm resonators. In this case, the attenuation at the low frequency side of the pass band is increased.

In a ladder filter according to another preferred embodiment of the present invention, the first to third parallel arm resonators are each preferably defined by a surface acoustic wave resonator. The electrostatic capacitance of the third parallel arm resonator is smaller than the electrostatic capacitances of the first and second parallel arm resonators and the duty ratio of the third parallel arm resonator is higher than the duty ratios of the first and second parallel arm resonators. In this case, the ladder filter is reduced in size and outstanding harmonic characteristics are achieved.

A preferred embodiment of the present invention provides a duplexer including the ladder filter according to a preferred embodiment of the present invention. In this case, the insertion loss is further reduced.

In a duplexer according to a preferred embodiment of the present invention, the ladder filter is preferably a transmission filter. In this case, the attenuation is increased in the pass band of the reception filter. Accordingly, outstanding isolation characteristics are achieved.

According to various preferred embodiments of the present invention, ladder filters and duplexers are provided that are capable of improving the out-of-band attenuation, achieving outstanding impedance matching, and reducing the insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described with reference to specific preferred embodiments of the present invention and the attached drawings.

The preferred embodiments described in the description are only examples and components in different preferred embodiments may be partially replaced or combined.

Figure 1:
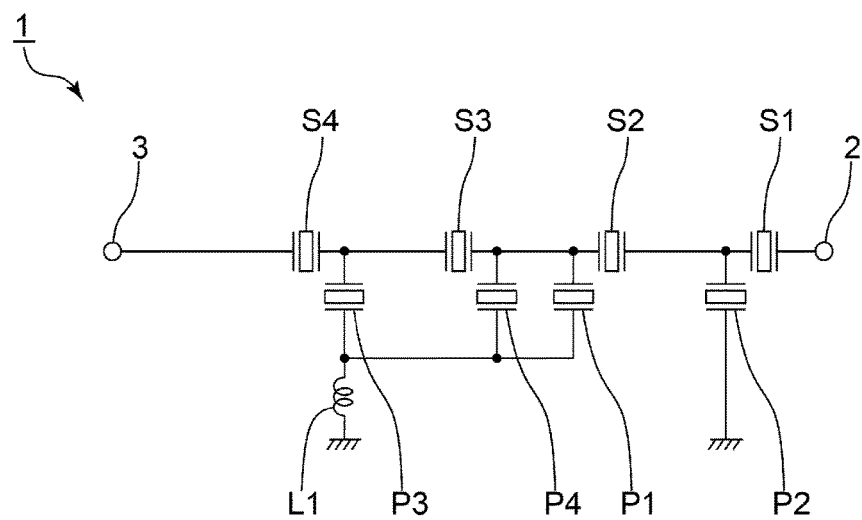
FIG. 1 is a circuit diagram of a ladder filter according to a first preferred embodiment of the present invention.

FIG. 1 is a circuit diagram of a ladder filter according to a first preferred embodiment of the present invention.

A ladder filter 1 includes a serial arm connected between an input terminal 2, which is an input end, and an output terminal 3, which is an output end, and multiple serial arm resonators S1 to S4 provided on the serial arm. In addition, the ladder filter 1 includes parallel arms connected between the serial arm and a ground potential and a first parallel arm resonator P1, second parallel arm resonators P2 and P3, and a third parallel arm resonator P4 provided on the parallel arms. More specifically, the first parallel arm resonator P1 and the third parallel arm resonator P4 are connected in parallel to each other between nodes between the serial arm resonator S2 and the serial arm resonator S3 and the ground potential. The second parallel arm resonator P2 is connected between a node between the serial arm resonator S1 and the serial arm resonator S2 and the ground potential. The second parallel arm resonator P3 is connected between a node between the serial arm resonator S3 and the serial arm resonator S4 and the ground potential.

Although the serial arm resonators S1 to S4 and the first to third parallel arm resonators P1 to P4 are not specifically limited, the serial arm resonators S1 to S4 and the first to third parallel arm resonators P1 to P4 are each preferably defined by a surface acoustic wave resonator including an interdigital transducer (IDT) electrode provided on a piezoelectric substrate. The surface acoustic wave resonator preferably includes reflectors that are arranged at both ends of the IDT electrode in a direction in which surface acoustic waves are propagated and that are provided on the piezoelectric substrate. The duty ratios of the first to third parallel arm resonators P1 to P4 are preferably about 0.53, for example. The duty ratio is the ratio of the width of electrode fingers of the IDT electrode used in the surface acoustic wave resonator to the pitch between the electrode fingers. Instead of the surface acoustic wave resonators, a boundary acoustic wave resonator(s) (BAW resonator(s)) may be partially used.

Figure 2:
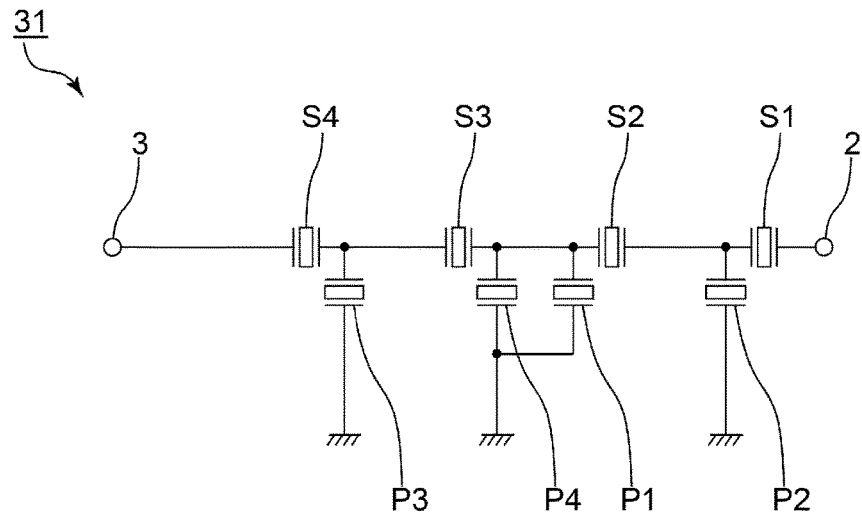
FIG. 2 is a circuit diagram of a ladder filter of a modification of the first preferred embodiment of the present invention.

In the present preferred embodiment, the ground potential side of the first parallel arm resonator P1, the second parallel arm resonator P3, and the third parallel arm resonator P4 are commonly connected to each other and is connected to the ground potential with an inductor L1 interposed therebetween. As in a ladder filter 31 in a modification of the present preferred embodiment of the present invention illustrated in FIG. 2, the ground potential side of the first parallel arm resonator P1, the second parallel arm resonator P3, and the third parallel arm resonator P4 may not be commonly connected to each other. No inductor may be connected between the second parallel arm resonator P3 and the ground potential. The same applies to the connection between the first parallel arm resonator P1 and the ground potential and between the third parallel arm resonator P4 and the ground potential.

The ladder filter 1, which is a band pass filter, has a certain pass band. The pass band is defined by the serial arm resonators S1 to S4 and the first and second parallel arm resonators P1, P2, and P3. The resonant frequencies of the serial arm resonators S1 to S4 and the anti-resonant frequencies of the first and second parallel arm resonators P1, P2, and P3 are positioned in the pass band. The anti-resonant frequency of the third parallel arm resonator P4 is positioned at the high frequency side of the pass band of the ladder filter 1. It is sufficient for the anti-resonant frequency of the third parallel arm resonator to be positioned outside the pass band of the ladder filter and the anti-resonant frequency of the third parallel arm resonator may be positioned at the low frequency side of the pass band.

In the present preferred embodiment, the electrostatic capacitance of the third parallel arm resonator P4 is preferably lower than the electrostatic capacitance of the first parallel arm resonator P1 and the anti-resonant frequency of the first parallel arm resonator P1 is positioned at the high frequency side of the anti-resonant frequencies of the second parallel arm resonators P2 and P3. Accordingly, outstanding impedance matching is achieved and the insertion loss is reduced. This will now be described by comparing the present preferred embodiment with first to third comparative examples.

The anti-resonant frequencies and the electrostatic capacitances of the respective parallel arm resonators in the present preferred embodiment and the first to third comparative examples are indicated in Table 1 to Table 4. The resonant frequencies of the respective serial arm resonators in the present preferred embodiment and the first to third comparative examples are indicated in Table 5 to Table 8. The values indicated in Table 1 to Table 8 are examples, and the anti-resonant frequencies and the electrostatic capacitances of the respective parallel arm resonators and the resonant frequencies of the respective serial arm resonators are not limited to the values indicated in Table 1 to Table 8. The circuit configurations of the first to third comparative examples will be described in detail below.

TABLE 1

| | | P1 | P2 | P3 | P4 |
|---|---|---|---|---|---|
| First preferred embodiment | Anti-resonant frequency | 722 MHz | 715 MHz | 717 MHz | 825 MHz |
| | Electrostatic capacitance | 2.5 pF | 5.4 pF | 4.9 pF | 1.0 pF |

TABLE 2

| | | P1 | P2 | P3 | P104 |
|---|---|---|---|---|---|
| First comparative example | Anti-resonant frequency | — | 715 MHz | 717 MHz | 825 MHz |
| | Electrostatic capacitance | — | 5.4 pF | 4.9 pF | 1.6 pF |

TABLE 3

| | | P111 | P112 | P113 | P114 |
|---|---|---|---|---|---|
| Second comparative example | Anti-resonant frequency | 720 MHz | 718 MHz | 718 MHz | 827 MHz |
| | Electrostatic capacitance | 3.5 pF | 4.4 pF | 4.9 pF | 1.0 pF |

TABLE 4

| | | P121 | P2 | P123 | P124 |
|---|---|---|---|---|---|
| Third comparative example | Anti-resonant frequency | 720 MHz | 715 MHz | 718 MHz | 825 MHz |
| | Electrostatic capacitance | 3.5 pF | 5.4 pF | 3.9 pF | 1.0 pF |

TABLE 5

| | S1 | S2 | S3 | S4 |
|---|---|---|---|---|
| First preferred embodiment | 745 MHz | 721 MHz | 720 MHz | 725 MHz |

TABLE 6

| | S1 | S2 | S3 | S4 |
|---|---|---|---|---|
| First comparative example | 745 MHz | 721 MHz | 720 MHz | 725 MHz |

TABLE 7

| | S111 | S112 | S113 | S114 |
|---|---|---|---|---|
| Second comparative example | 746 MHz | 722 MHz | 721 MHz | 726 MHz |

TABLE 8

| | S1 | S2 | S3 | S4 |
|---|---|---|---|---|
| Third comparative example | 745 MHz | 721 MHz | 720 MHz | 725 MHz |

Figure 3:
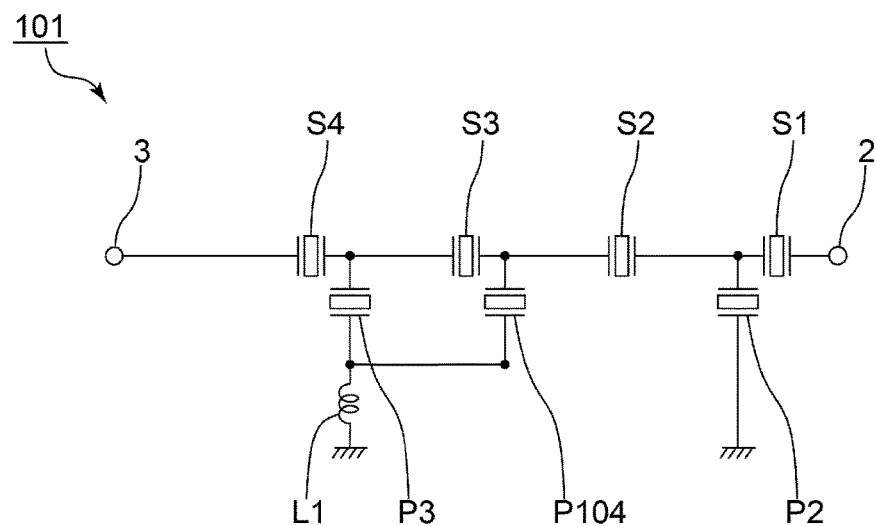
FIG. 3 is a circuit diagram of a ladder filter of a first comparative example.

FIG. 3 is a circuit diagram of a ladder filter of the first comparative example.

A ladder filter 101 of the first comparative example differs from the first preferred embodiment in that the ladder filter 101 does not include the first parallel arm resonator. As indicated in Table 1 and Table 2, the electrostatic capacitance of a third parallel arm resonator P104 also differs from that of the third parallel arm resonator P4 in the first preferred embodiment. The ladder filter 101 has the same or substantially the same configuration as that of the ladder filter 1 of the first preferred embodiment in the remaining aspects.

As indicated in Table 1, the anti-resonant frequencies of the respective parallel arm resonators in the present preferred embodiment are preferably as follows: the anti-resonant frequency of the first parallel arm resonator P1 is about 722 MHz, the anti-resonant frequency of the second parallel arm resonator P2 is about 715 MHz, the anti-resonant frequency of the second parallel arm resonator P3 is about 717 MHz, and the anti-resonant frequency of the third parallel arm resonator P4 is about 825 MHz, for example. The second parallel arm resonators P2 and P3 and the third parallel arm resonator P4 in the first comparative example have the same or substantially the same anti-resonant frequencies as those in the present preferred embodiment. As indicated in Table 5, the resonant frequencies of the respective serial arm resonators in the present preferred embodiment are preferably as follows: the resonant frequency of the serial arm resonator S1 is about 745 MHz, the resonant frequency of the serial arm resonator S2 is about 721 MHz, the resonant frequency of the serial arm resonator S3 is about 720 MHz, and the resonant frequency of the serial arm resonator S4 is about 725 MHz, for example. The serial arm resonators S1 to S4 in the first comparative example have the same or substantially the same resonant frequencies as those in the present preferred embodiment.

As indicated in Table 1, the electrostatic capacitances of the respective parallel arm resonators in the present preferred embodiment are preferably as follows: the electrostatic capacitance of the first parallel arm resonator P1 is about 2.5 pF, the electrostatic capacitance of the second parallel arm resonator P2 is about 5.4 pF, the electrostatic capacitance of the second parallel arm resonator P3 is about 4.9 pF, and the electrostatic capacitance of the third parallel arm resonator P4 is about 1.0 pF, for example. As indicated above, the electrostatic capacitance of the third parallel arm resonator P4 is preferably lower than the electrostatic capacitances of the first and second parallel arm resonators P1, P2, and P3.

The ladder filter 101 of the first comparative example includes the third parallel arm resonator P104, as in the first preferred embodiment. The impedance of the third parallel arm resonator P104 is of an inductive type in a frequency range from the resonant frequency to the anti-resonant frequency of the third parallel arm resonator P104. In contrast, the impedance of the third parallel arm resonator P104 is of a capacitive type in a frequency range lower than the resonant frequency of the third parallel arm resonator P104 or in the pass band of the ladder filter 101, which is a frequency range higher than the anti-resonant frequency of the third parallel arm resonator P104. The impedance of the ladder filter 101 moves to the capacitive type in the pass band of the ladder filter 101 due to the influence of the capacitance of the third parallel arm resonator P104. Accordingly, the impedance matching is degraded and the insertion loss is increased.

In contrast, in the present preferred embodiment, the third parallel arm resonator P4 is connected in parallel to the first parallel arm resonator P1 and the electrostatic capacitance of the third parallel arm resonator P4 is lower than the electrostatic capacitance of the first parallel arm resonator P1. Accordingly, the capacitance of the third parallel arm resonator P4 has only a minor influence on the impedance matching in the pass band of the ladder filter 1. Consequently, outstanding impedance matching is achieved and the insertion loss is reduced.

In addition, since the anti-resonant frequency of the third parallel arm resonator P4 is positioned outside the pass band of the ladder filter 1, an attenuation pole is provided outside the pass band. Accordingly, the attenuation outside the pass band is increased.

Figure 4:
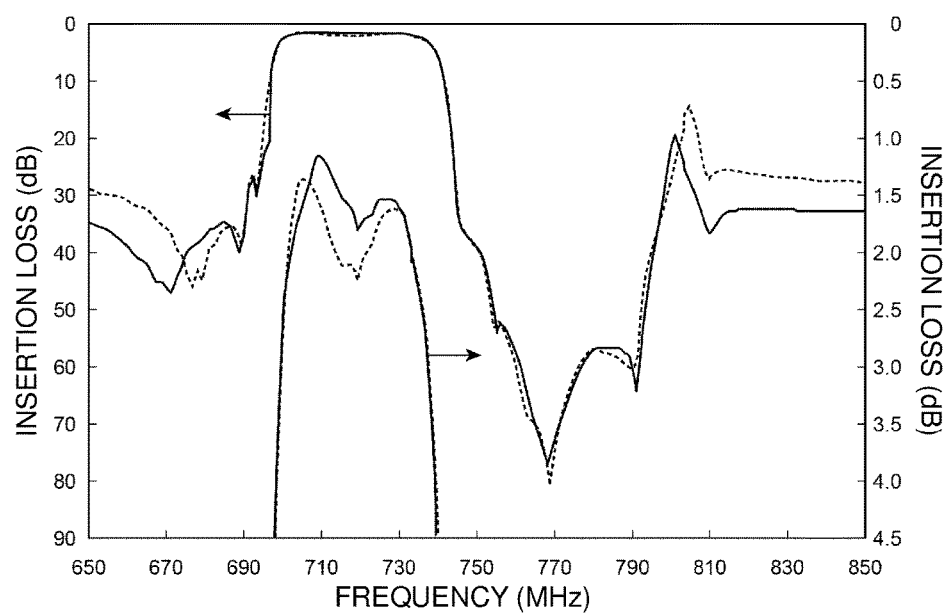
FIG. 4 is a graph indicating attenuation-frequency characteristics of the ladder filter according to the first preferred embodiment of the present invention and the ladder filter of the first comparative example.

FIG. 4 is a graph indicating attenuation-frequency characteristics of the ladder filter according to the first preferred embodiment and the ladder filter of the first comparative example. A solid line indicates the attenuation-frequency characteristic of the present preferred embodiment and a broken line indicates the attenuation-frequency characteristic of the first comparative example.

The pass bands of the ladder filter of the present preferred embodiment and the ladder filter of the first comparative example are within a range from about 703 MHz to about 733 MHz inclusive. In the description, the insertion loss means the loss in a portion having the greatest loss in the pass band. The insertion loss in the first comparative example is about 2.22 dB and the insertion loss in the present preferred embodiment is about 1.93 dB. As described above, the insertion loss is reduced in the present preferred embodiment.

In addition, it is indicated that an attenuation pole is provided at about 790 MHz outside the pass bands of the ladder filters in the present preferred embodiment. Accordingly, for example, in a frequency range from about 758 MHz to about 788 MHz inclusive, an attenuation of about 50 dB occurs. This is because the third parallel arm resonator is provided.

Figure 5A:
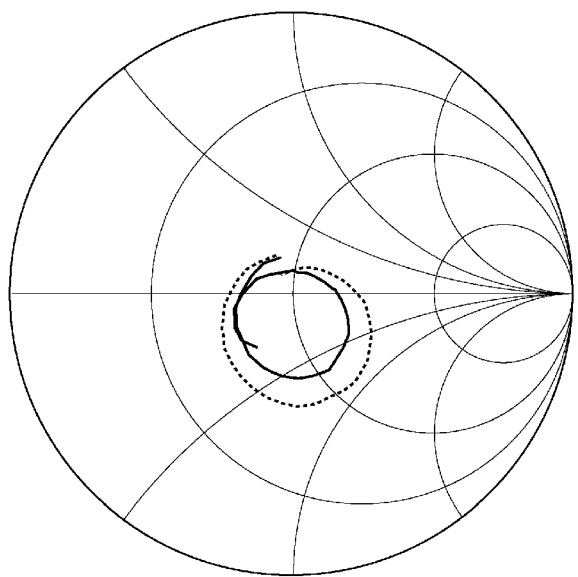
FIG. 5A is a diagram illustrating impedance matching at an output end in a pass band of each of the ladder filter according to the first preferred embodiment and the ladder filter of the first comparative example and FIG. 5B is a diagram illustrating impedance matching at an input end in the pass band of each of the ladder filter according to the first preferred embodiment of the present invention and the ladder filter of the first comparative example.
Figure 5B:
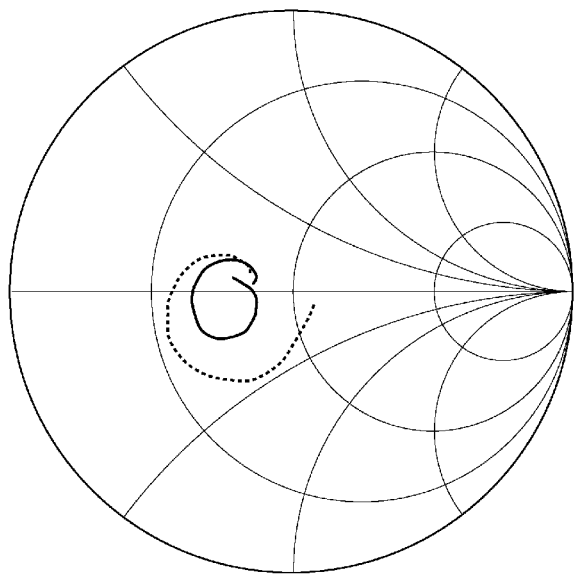

FIG. 5A is a diagram illustrating impedance matching at the output end in the pass band of each of the ladder filter according to the first preferred embodiment and the ladder filter of the first comparative example. FIG. 5B is a diagram illustrating impedance matching at the input end in the pass band of each of the ladder filter according to the first preferred embodiment and the ladder filter of the first comparative example. A solid line indicates a result of the present preferred embodiment and a broken line indicates a result of the first comparative example.

As illustrated in FIGS. 5A and 5B, the broken line indicating the result of the first comparative example spreads widely. In contrast, the spread of the solid line indicating the result of the present preferred embodiment is small and the track of the solid line is close to a circle. Accordingly, outstanding impedance matching is achieved in the present preferred embodiment.

Figure 6:
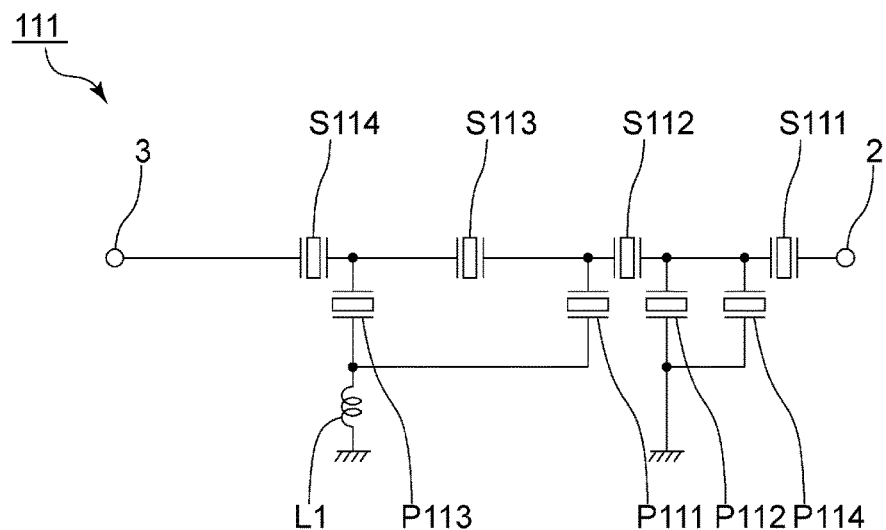
FIG. 6 is a circuit diagram of a ladder filter of a second comparative example.

FIG. 6 is a circuit diagram of a ladder filter of the second comparative example.

In a ladder filter 111 of the second comparative example, the arrangement of a second parallel arm resonator P112 and a third parallel arm resonator P114 differs from the arrangement of the second parallel arm resonator P2 and the third parallel arm resonator P4 in the first preferred embodiment. As indicated in Tables 1 and 3 and Tables 5 and 7, the anti-resonant frequencies of the first to third parallel arm resonators P111 to P114 and the resonant frequencies of the serial arm resonator S111 to S114 also differ from the anti-resonant frequencies of the first to third parallel arm resonators P1 to P4 and the resonant frequencies of the serial arm resonators S1 to S4 in the first preferred embodiment. The ladder filter 111 has the same or substantially the same configuration as that of the ladder filter 1 of the first preferred embodiment in the remaining aspects.

The second parallel arm resonator P112 and the third parallel arm resonator P114 are connected in parallel to each other between nodes between the serial arm resonator S111 and the serial arm resonator S112 in the ladder filter 111 and the ground potential.

As indicated in Table 3, in the second comparative example, the anti-resonant frequency of the second parallel arm resonator P112 is positioned at the low frequency side of the anti-resonant frequency of the first parallel arm resonator P111, as in the present preferred embodiment. Accordingly, the frequency range from the anti-resonant frequency of the second parallel arm resonator P112 to the resonant frequencies of the serial arm resonators S111 to S114 are wide. In the second comparative example, the third parallel arm resonator P114 is connected in parallel to the second parallel arm resonator P112. The anti-resonant frequency of the second parallel arm resonator P112 is moved to the low frequency side due to the influence of the third parallel arm resonator P114. Accordingly, a wider frequency range in the pass band is of the capacitive type. Consequently, the impedance matching in the pass band is degraded.

In addition, in the second comparative example, the third parallel arm resonator P114 is connected in parallel to the second parallel arm resonator P112 positioned closest to the input end, among the parallel arm resonators composing the pass band. Accordingly, the impedance in the pass band is likely to be moved to the capacitive type at the input end side of the ladder filter 111 of the second comparative example. Consequently, the impedance matching in the pass band at the input end side of the ladder filter 111 of the second comparative example is further degraded.

In contrast, in the present preferred embodiment, the third parallel arm resonator P4 is connected in parallel to the first parallel arm resonator P1 having the highest anti-resonant frequency, among the parallel arm resonators of the pass band, as illustrated in FIG. 1. The first parallel arm resonator P1 is directly connected to the serial arm resonator S2 and the serial arm resonator S3 without any serial arm resonator interposed therebetween. The anti-resonant frequency of the first parallel arm resonator P1 is positioned at the high frequency side of the resonant frequencies of both the serial arm resonator S2 and the serial arm resonator S3. Accordingly, the capacitive frequency range does not exist in view of only the anti-resonant frequency of the first parallel arm resonator P1 and the resonant frequencies of the serial arm resonator S2 and the serial arm resonator S3.

The anti-resonant frequency of the first parallel arm resonator P1 is moved to the low frequency side due to the influence of the third parallel arm resonator P4. Also in this case, since the frequency range from the anti-resonant frequency of the first parallel arm resonator P1 to the resonant frequencies of the serial arm resonator S2 and the serial arm resonator S3 is further narrowed, the capacitive frequency range is significantly reduced or minimized.

In addition, the ladder filter 1 includes the multiple second parallel arm resonators. The second parallel arm resonators P2 and P3 are the parallel arm resonator positioned closest to the input end and the parallel arm resonator positioned closest to the output end, respectively. The first parallel arm resonator P1 is positioned so as to be spaced apart from the input end side and the output end side with the serial arm resonator S2 and the serial arm resonator S3 interposed therebetween, respectively. Accordingly, the movement of the impedance of the ladder filter 1 in the pass band to the capacitive type is unlikely to occur at the input end side and the output end side of the ladder filter 1. Consequently, outstanding impedance matching is achieved in the ladder filter 1.

It is sufficient for the anti-resonant frequency of the first parallel arm resonator to be positioned at the high frequency side of the resonant frequency of at least one serial arm resonator, among the multiple serial arm resonators. This narrows the frequency range from the anti-resonant frequency of the first parallel arm resonator to the resonant frequency of each serial arm resonator. Accordingly, the capacitive frequency range is narrowed. The anti-resonant frequency of the first parallel arm resonator is preferably positioned at the high frequency side of the resonant frequency of either of the serial arm resonators that are directly connected to the first parallel arm resonator without any serial arm resonator interposed therebetween. This effectively reduces or prevents the influence of the capacitance. The anti-resonant frequency of the first parallel arm resonator P1 is more preferably positioned at the high frequency side of the resonant frequencies of both the serial arm resonator S2 and the serial arm resonator S3, as in the present preferred embodiment.

It is sufficient for the ladder filter to include at least one second parallel arm resonator. Also in this case, the insertion loss is reduced.

Figure 7:
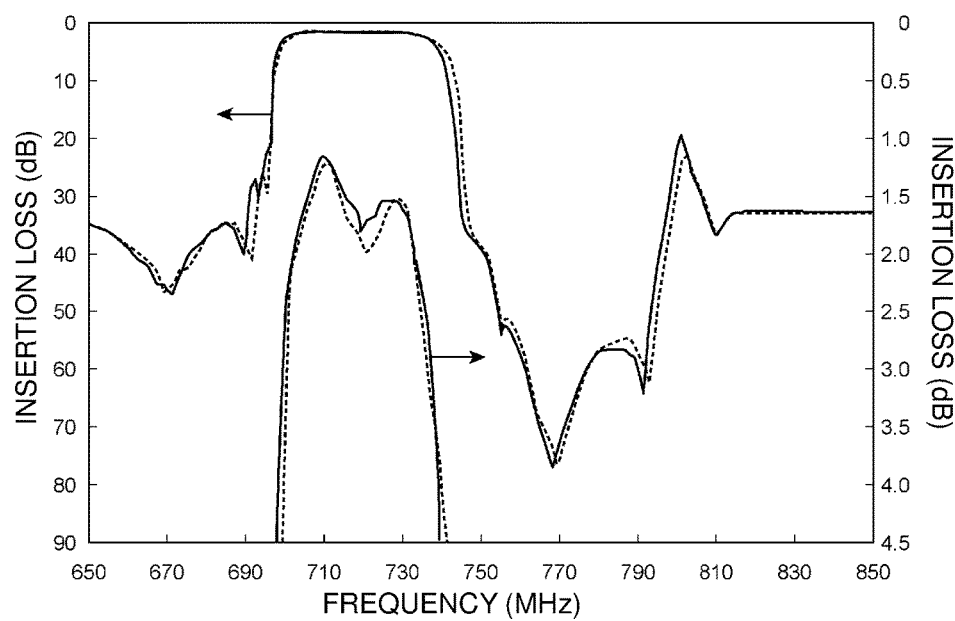
FIG. 7 is a graph indicating attenuation-frequency characteristics of the ladder filter according to the first preferred embodiment of the present invention and the ladder filter of the second comparative example.

FIG. 7 is a graph indicating attenuation-frequency characteristics of the ladder filter according to the first preferred embodiment and the ladder filter of the second comparative example. A solid line indicates the attenuation-frequency characteristic of the present preferred embodiment and a broken line indicates the attenuation-frequency characteristic of the second comparative example.

As indicated in FIG. 7, the insertion loss of the second comparative example is about 2.01 dB. Accordingly, the insertion loss of the present preferred embodiment is smaller than the insertion loss of the second comparative example.

Figure 8A:
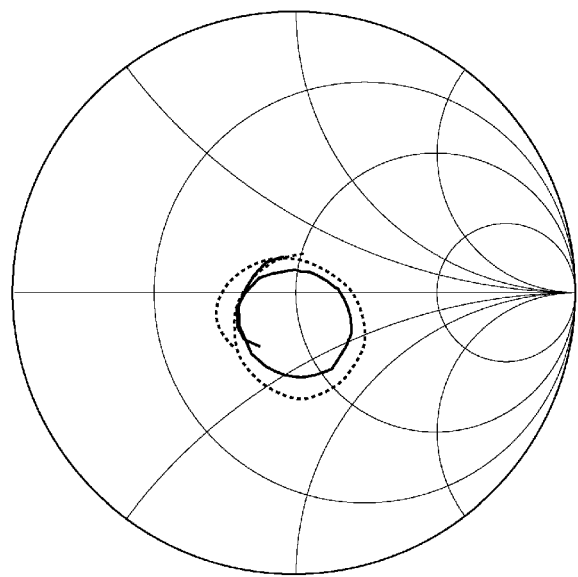
FIG. 8A is a diagram illustrating impedance matching at the output end in the pass band of each of the ladder filter according to the first preferred embodiment and the ladder filter of the second comparative example and FIG. 8B is a diagram illustrating impedance matching at the input end in the pass band of each of the ladder filter according to the first preferred embodiment of the present invention and the ladder filter of the second comparative example.
Figure 8B:
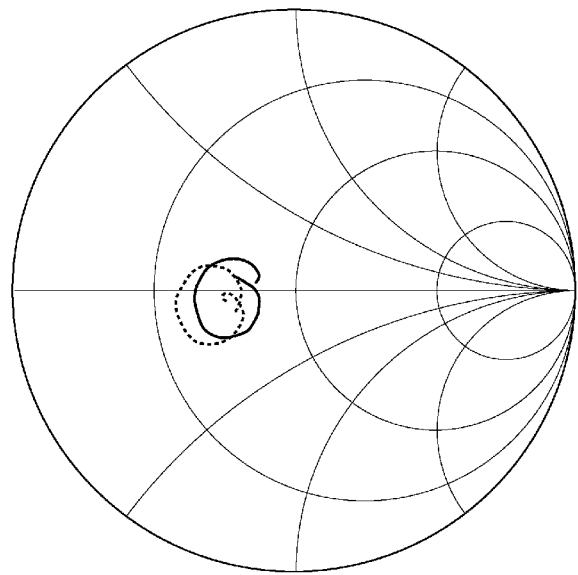

FIG. 8A is a diagram illustrating impedance matching at the output end in the pass band of each of the ladder filter according to the first preferred embodiment and the ladder filter of the second comparative example. FIG. 8B is a diagram illustrating impedance matching at the input end in the pass band of each of the ladder filter according to the first preferred embodiment and the ladder filter of the second comparative example. A solid line indicates a result of the present preferred embodiment and a broken line indicates a result of the second comparative example.

As illustrated in FIG. 8A, the broken line indicating the result of the second comparative example spreads widely. In contrast, the spread of the solid line indicating the result of the present preferred embodiment is small and the track of the solid line is close to a circle. As illustrated in FIG. 8B, the impedance is deviated from 50Ω at the input side in the result of the second comparative example. In contrast, in the result of the present preferred embodiment, the impedance is close to 50Ω. Accordingly, outstanding impedance matching is achieved in the present preferred embodiment.

Figure 9:
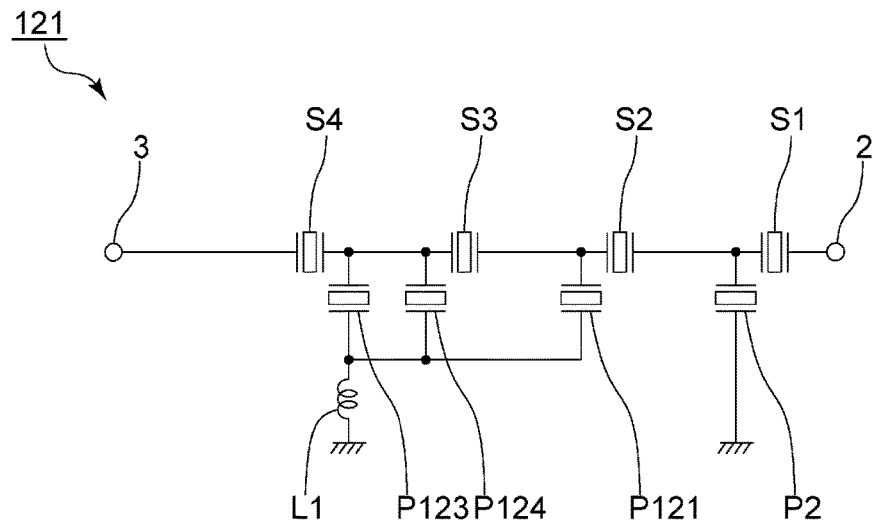
FIG. 9 is a circuit diagram of a ladder filter of a third comparative example.

FIG. 9 is a circuit diagram of a ladder filter of the third comparative example.

In a ladder filter 121 of the third comparative example, the arrangement of a third parallel arm resonator P124 differs from the arrangement of the third parallel arm resonator P4 in the first preferred embodiment. As indicated in Table 4, the anti-resonant frequencies of a first parallel arm resonator P121 and a second parallel arm resonator P123 also differ from the anti-resonant frequencies of the first parallel arm resonator P1 and the second parallel arm resonator P3 in the first preferred embodiment. The ladder filter 121 has the same or substantially the same configuration as that of the ladder filter 1 of the first preferred embodiment in the remaining aspects.

The third parallel arm resonator P124 and the second parallel arm resonator P123 are connected in parallel to each other between nodes between the serial arm resonator S3 and the serial arm resonator S4 in the ladder filter 121 and the ground potential.

As indicated in Table 4, the anti-resonant frequency of the second parallel arm resonator P123 is positioned at the low frequency side of the anti-resonant frequency of the first parallel arm resonator P121. In the third comparative example, the third parallel arm resonator P124 is connected in parallel to the second parallel arm resonator P123. Accordingly, the impedance matching in the pass band is degraded, as in the second comparative example.

In addition, in the third comparative example, the third parallel arm resonator P124 is connected in parallel to the second parallel arm resonator P123 positioned closest to the output end, among the parallel arm resonators composing the pass band. Accordingly, the impedance in the pass band is likely to be moved to the capacitive type at the output end side. Consequently, the impedance matching at the output end side is further degraded.

In contrast, in the present preferred embodiment, the third parallel arm resonator P4 is connected in parallel to the first parallel arm resonator P1, as illustrated in FIG. 1. The first parallel arm resonator P1 is not positioned closest to the output end, among the parallel arm resonators composing the pass band. In addition, the first parallel arm resonator P1 has the highest anti-resonant frequency, among the parallel arm resonators composing the pass band. Accordingly, outstanding impedance matching is achieved.

Figure 10:
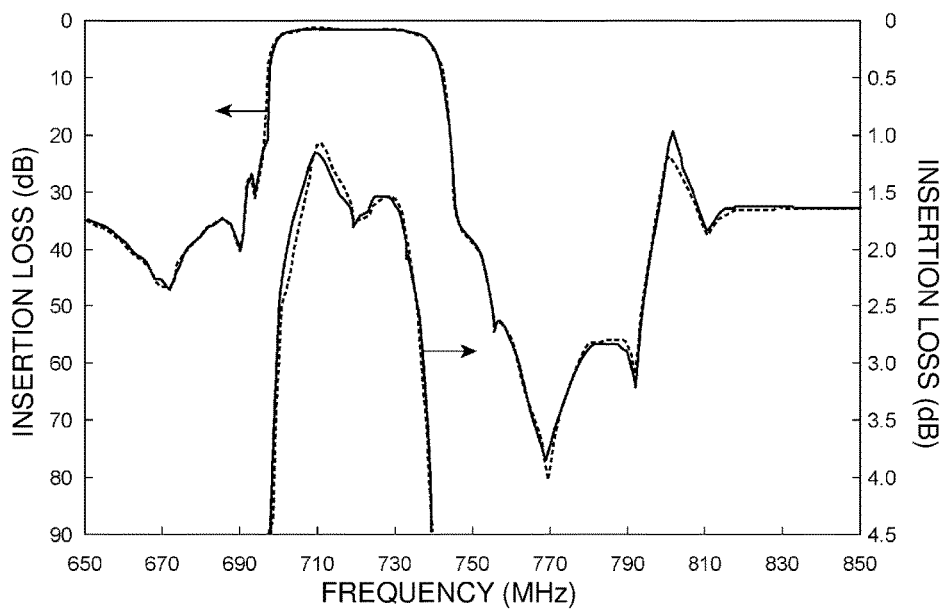
FIG. 10 is a graph indicating attenuation-frequency characteristics of the ladder filter according to the first preferred embodiment of the present invention and the ladder filter of the third comparative example.

FIG. 10 is a graph indicating attenuation-frequency characteristics of the ladder filter according to the first preferred embodiment and the ladder filter of the third comparative example. A solid line indicates the attenuation-frequency characteristic of the present preferred embodiment and a broken line indicates the attenuation-frequency characteristic of the third comparative example.

As indicated in FIG. 10, the insertion loss of the third comparative example is about 2.06 dB. Accordingly, the insertion loss of the present preferred embodiment is smaller than the insertion loss of the third comparative example.

Figure 11A:
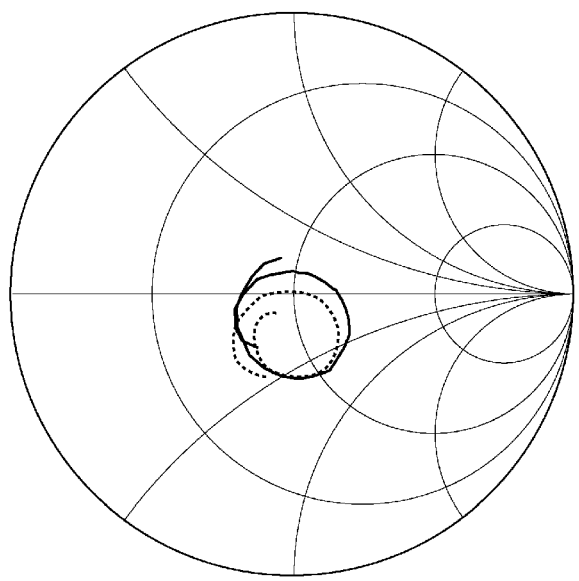
FIG. 11A is a diagram illustrating impedance matching at the output end in the pass band of each of the ladder filter according to the first preferred embodiment and the ladder filter of the third comparative example and FIG. 11B is a diagram illustrating impedance matching at the input end in the pass band of each of the ladder filter according to the first preferred embodiment of the present invention and the ladder filter of the third comparative example.
Figure 11B:
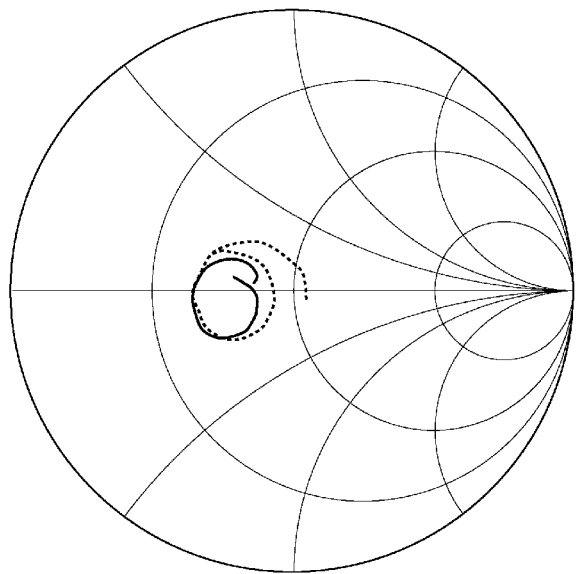

FIG. 11A is a diagram illustrating impedance matching at the output end in the pass band of each of the ladder filter according to the first preferred embodiment and the ladder filter of the third comparative example. FIG. 11B is a diagram illustrating impedance matching at the input end in the pass band of each of the ladder filter according to the first preferred embodiment and the ladder filter of the third comparative example. A solid line indicates a result of the present preferred embodiment and a broken line indicates a result of the third comparative example.

As illustrated in FIG. 11A, in the result of the present preferred embodiment, the impedance is closer to 50Ω at the output end side, compared with the third communication example. As illustrated in FIG. 11B, the broken line indicating the result of the third comparative example spreads widely. In contrast, the spread of the solid line indicating the result of the present preferred embodiment is small and the track of the solid line is close to a circle. Accordingly, outstanding impedance matching is achieved in the present preferred embodiment.

A second preferred embodiment of the present invention will now be described. In the second preferred embodiment, the configuration of the third parallel arm resonator differs from that in the first preferred embodiment. A ladder filter of the second preferred embodiment has the same or substantially the same configuration as that of the ladder filter of the first preferred embodiment in the other points.

More specifically, preferably, the duty ratio of the third parallel arm resonator in the first preferred embodiment is about 0.53 while the duty ratio of the third parallel arm resonator in the second preferred embodiment is about 0.63, for example. As described above, the duty ratio is the ratio between the electrode fingers of the IDT electrode used in an elastic wave resonator and the pitch between the electrode fingers. The area ratio of the electrode fingers in the IDT electrode is increased with the increasing duty ratio. Accordingly, the electrostatic capacitance is increased with the increasing duty ratio with the same area of the IDT electrode. In other words, the area of the IDT electrode with respect to the magnitude of the electrostatic capacitance is decreased by increasing the duty ratio.

The electrostatic capacitance of the third parallel arm resonator in the second preferred embodiment is equal or substantially equal to the electrostatic capacitance of the third parallel arm resonator in the first preferred embodiment. Accordingly, in the second preferred embodiment, the area of the third parallel arm resonator is further decreased. More specifically, for example, the intersecting width of the IDT electrode used in the third parallel arm resonator in the second preferred embodiment may preferably be smaller than the intersecting width of the IDT electrode used in the third parallel arm resonator in the first preferred embodiment by about 15%.

Figure 12:
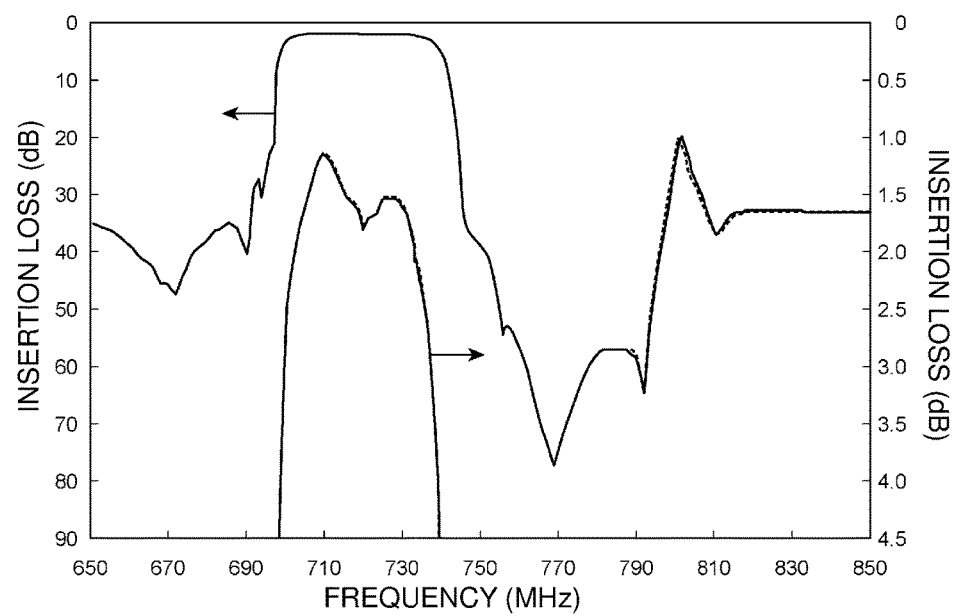
FIG. 12 is a graph indicating attenuation-frequency characteristics of the ladder filters according to the first and second preferred embodiments of the present invention.
Figure 13A:
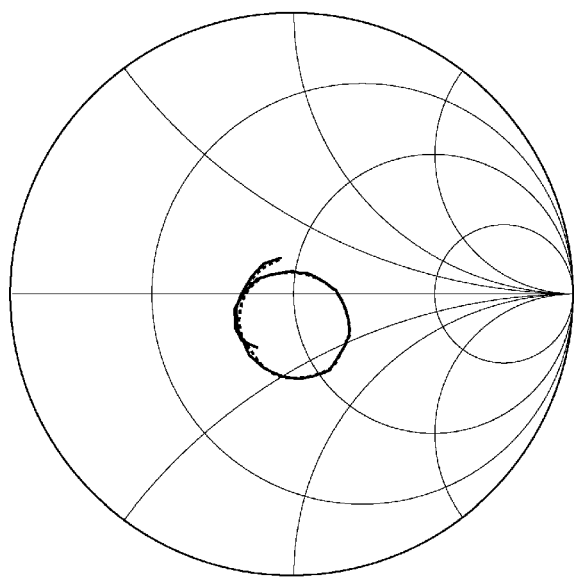
FIG. 13A is a diagram illustrating impedance matching at the output end in the pass band of each of the ladder filters according to the first and second preferred embodiments and FIG. 13B is a diagram illustrating impedance matching at the input end in the pass band of each of the ladder filters according to the first and second preferred embodiments of the present invention.
Figure 13B:
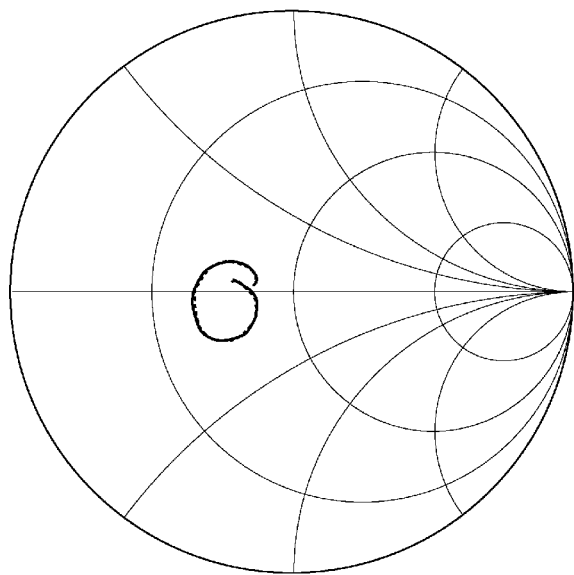

FIG. 12 is a graph indicating attenuation-frequency characteristics of the ladder filters according to the first and second preferred embodiments. FIG. 13A is a diagram illustrating impedance matching at the output end in the pass band of each of the ladder filters according to the first and second preferred embodiments. FIG. 13B is a diagram illustrating impedance matching at the input end in the pass band of each of the ladder filters according to the first and second preferred embodiments. Referring to FIG. 12 and FIGS. 13A and 13B, a solid line indicates a result of the first preferred embodiment and a broken line indicates a result of the second preferred embodiment.

As indicated in FIG. 12, the insertion loss in the second preferred embodiment is equal or substantially equal to the insertion loss in the first preferred embodiment. As illustrated in FIGS. 13A and 13B, the impedance matching in the second preferred embodiment is also the same or substantially the same as the impedance matching in the first preferred embodiment. As described above, an advantage similar to that in the first preferred embodiment is achieved in the present preferred embodiment. In addition, the ladder filter is further reduced in size.

A third preferred embodiment of the present invention will now be described. In the third preferred embodiment, the configuration of the first and second parallel arm resonators differs from that in the first preferred embodiment. A ladder filter of the third preferred embodiment has the same or substantially the same configuration as that of the ladder filter of the first preferred embodiment in the remaining aspects.

More specifically, the duty ratios of the first and second parallel arm resonators in the first preferred embodiment are preferably about 0.53 while the duty ratios of the first and second parallel arm resonators in the third preferred embodiment are preferably about 0.63, for example. The electrostatic capacitances of the first and second parallel arm resonators in the third preferred embodiment are preferably equal or substantially equal to the electrostatic capacitances of the first and second parallel arm resonators in the first preferred embodiment. The electrostatic capacitance of the surface acoustic wave resonator is proportional to the product of the duty ratio, the intersecting width, and the number of pairs of the electrode fingers. When the electrostatic capacitance is constant and a wavelength λ determined by the period of the electrode fingers is constant, increasing the duty ratio decreases the number of pairs of the electrode fingers and the distance of the intersecting width. Accordingly, the area of the first and second parallel arm resonators is further decreased.

Figure 14:
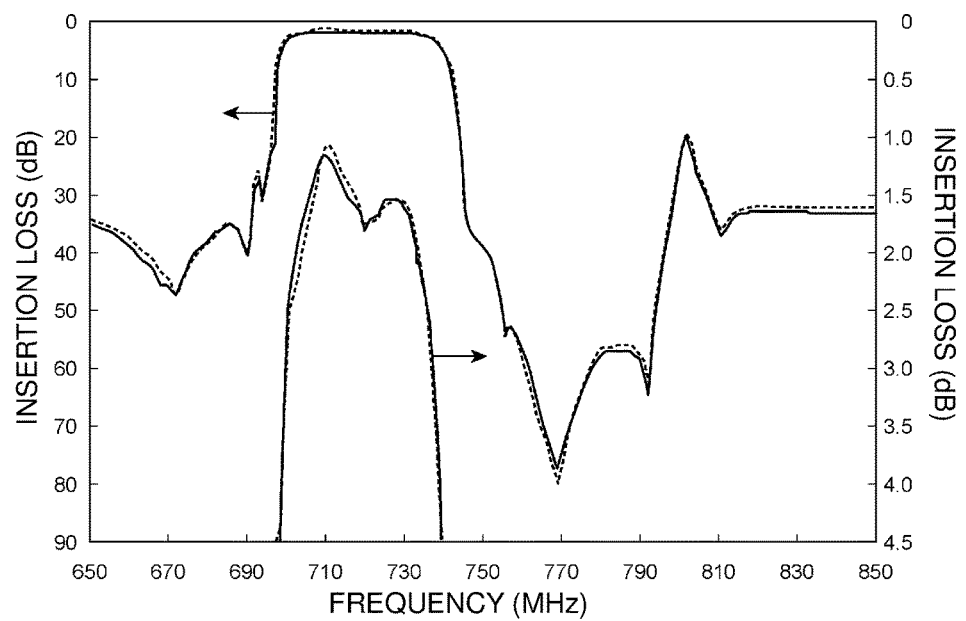
FIG. 14 is a graph indicating attenuation-frequency characteristics of the ladder filters according to the first and third preferred embodiments of the present invention.
Figure 15A:
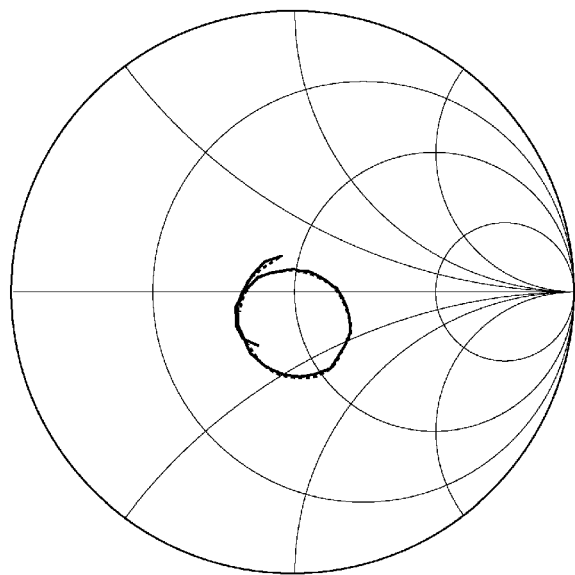
FIG. 15A is a diagram illustrating impedance matching at the output end in the pass band of each of the ladder filters according to the first and third preferred embodiments and FIG. 15B is a diagram illustrating impedance matching at the input end in the pass band of each of the ladder filters according to the first and third preferred embodiments of the present invention.
Figure 15B:
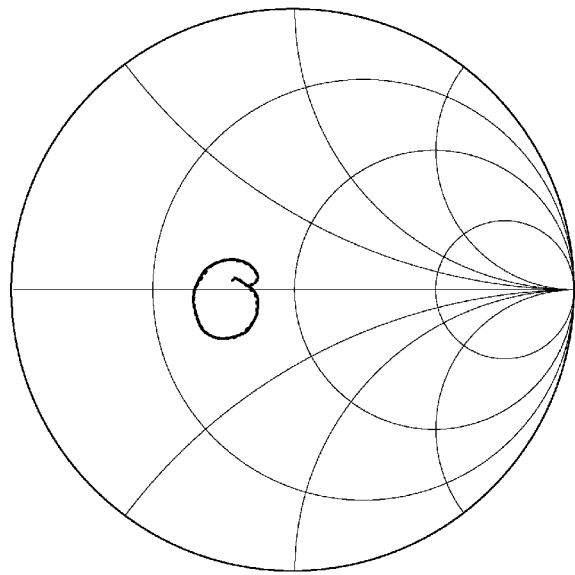

FIG. 14 is a graph indicating attenuation-frequency characteristics of the ladder filters according to the first and third preferred embodiments. FIG. 15A is a diagram illustrating impedance matching at the output end in the pass band of each of the ladder filters according to the first and third preferred embodiments. FIG. 15B is a diagram illustrating impedance matching at the input end in the pass band of each of the ladder filters according to the first and third preferred embodiments. Referring to FIG. 14 and FIGS. 15A and 15B, a solid line indicates a result of the first preferred embodiment and a broken line indicates a result of the third preferred embodiment.

As indicated in FIG. 14, the insertion loss in the third preferred embodiment is equal or substantially equal to the insertion loss in the first preferred embodiment. As illustrated in FIGS. 15A and 15B, the impedance matching in the third preferred embodiment is also the same or substantially the same as the impedance matching in the first preferred embodiment. Accordingly, in the present preferred embodiment, in addition to the advantages of the first preferred embodiment, the ladder filter is further reduced in size.

Figure 16:
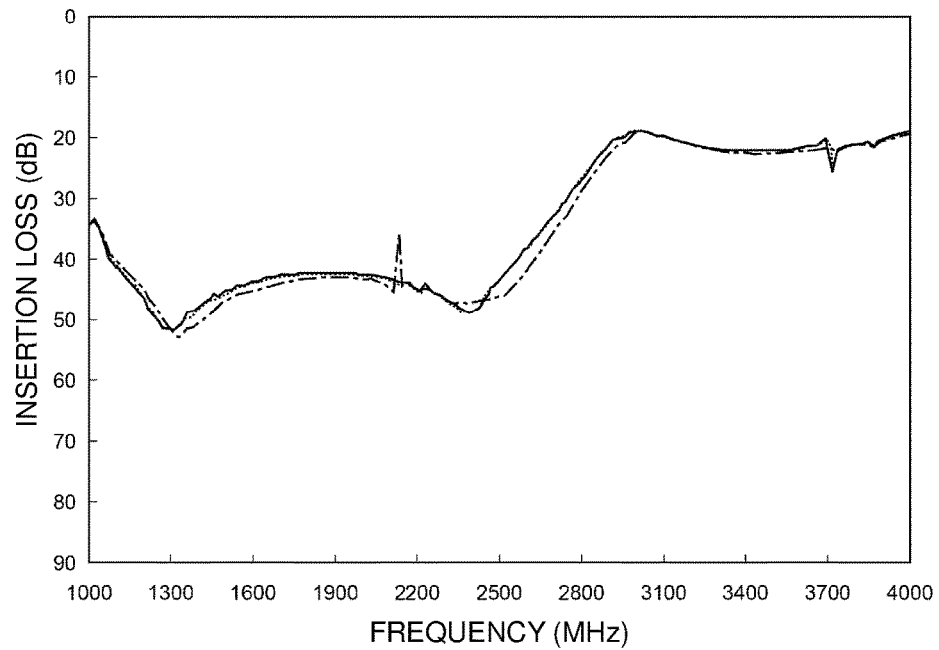
FIG. 16 is a graph indicating harmonic characteristics of the ladder filters according to the first to third preferred embodiments of the present invention.

FIG. 16 is a graph indicating harmonic characteristics of the ladder filters according to the first to third preferred embodiments. A solid line indicates a result of the first preferred embodiment, a broken line indicates a result of the second preferred embodiment, and an alternate long and short dash line indicates a result of the third preferred embodiment.

In the first to third preferred embodiments, preferably the frequency range of second harmonic waves is from about 1,406 MHz to about 1,466 MHz inclusive and the frequency range of third harmonic waves is from about 2,109 MHz to about 2,199 MHz inclusive, for example. As indicated in FIG. 16, in the frequency range of the second harmonic waves, all of the ladder filters according to the first to third preferred embodiments achieve preferable attenuation characteristics.

In contrast, in the frequency range of the third harmonic waves, preferred attenuation characteristics are achieved in the ladder filters according to the first and second preferred embodiments. This is because an occurrence of a spurious signal is reduced or prevented in the frequency range of the third harmonic waves with the ladder filters according to the first and second preferred embodiments.

The spurious signal is generated due to an occurrence of unnecessary oscillation in the IDT electrode used in the resonator. The size of the spurious signal depends on the duty ratio and the electrostatic capacitance of the IDT electrode used in the parallel arm resonator. The spurious signal is reduced in size as the duty ratio of the IDT electrode approaches about 0.5, for example. Alternatively, the spurious signal is reduced in size as the electrostatic capacitance of the IDT electrode is decreased.

As described above, the increase in the duty ratio decreases the area of the IDT electrode with respect to the magnitude of the electrostatic capacitance. In contrast, the spurious signal is increased in size as the duty ratio is increased to a value of about 0.5 or more, for example. Accordingly, as in the second preferred embodiment, the duty ratio of the IDT electrode used in the parallel arm resonator having a small electrostatic capacitance with which the spurious signal is reduced in size is preferably increased. In the second preferred embodiment, in addition to the reduction in size, outstanding harmonic characteristics are achieved.

Figure 17:
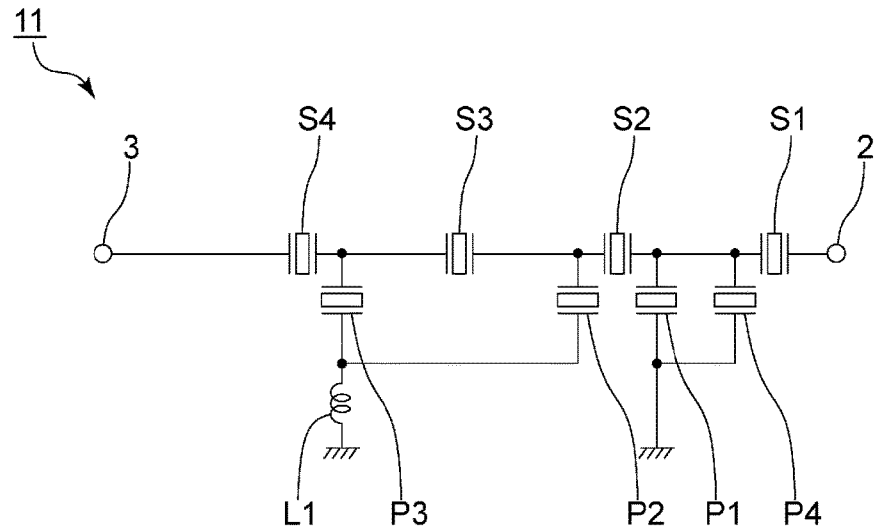
FIG. 17 is a circuit diagram of a ladder filter according to a fourth preferred embodiment of the present invention.

FIG. 17 is a circuit diagram of a ladder filter according to a fourth preferred embodiment of the present invention.

A ladder filter 11 differs from the first preferred embodiment in the arrangement of the first parallel arm resonator P1, the second parallel arm resonator P2, and the third parallel arm resonator P4. The ladder filter 11 has the same or substantially the same configuration as that of the ladder filter 1 of the first preferred embodiment in the remaining aspects.

In the present preferred embodiment, among the parallel arm resonators defining the pass band, the first parallel arm resonator P1 is positioned closest to the input end. The third parallel arm resonator P4 is connected in parallel to the first parallel arm resonator P1, as in the first preferred embodiment. Also in this case, the insertion loss is reduced.

Among the parallel arm resonators defining the pass band, preferably, the first parallel arm resonator may be positioned closest to the output end and the third parallel arm resonator may be connected in parallel to the first parallel arm resonator. Also in this case, the insertion loss is reduced.

Preferred embodiments of the present invention are preferably applied to, for example, a duplexer, in addition to the ladder filter.

Figure 18:
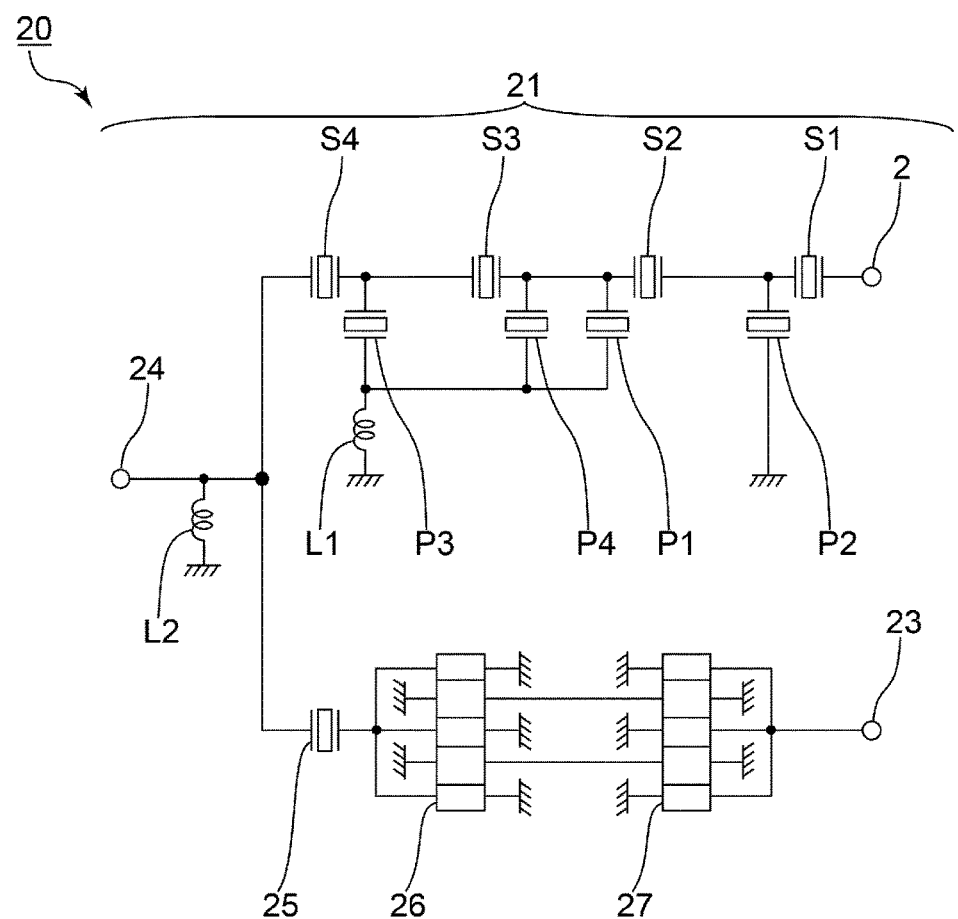
FIG. 18 is a circuit diagram of a duplexer according to a fifth preferred embodiment of the present invention.

FIG. 18 is a circuit diagram of a duplexer according to a fifth preferred embodiment of the present invention.

A duplexer 20 includes a transmission filter and a reception filter having a pass band different from that of the transmission filter. More specifically, preferably, the pass band of the transmission filter is from about 703 MHz to about 733 MHz inclusive and the pass band of the reception filter is from about 758 MHz to about 788 MHz inclusive, for example. The pass bands of the transmission filter and the reception filter are not limited to the ones described above.

The transmission filter of the present preferred embodiment is a ladder filter 21 having the same or substantially the same configuration as that of the ladder filter 1 according to the first preferred embodiment. The output end of the ladder filter 21 is a terminal 24. The terminal 24 is connected to an antenna. An impedance adjustment inductor L2 is connected between the terminal 24 and the ground potential.

The reception filter includes a resonator 25, a longitudinally coupled resonator elastic wave filter 26, and a longitudinally coupled resonator elastic wave filter 27, which are connected between the terminal 24 and an output terminal 23. The resonator 25, the longitudinally coupled resonator elastic wave filter 26, and the longitudinally coupled resonator elastic wave filter 27 are connected in series to each other. The reception filter is not limited the above configuration. For example, any of the ladder filters according to preferred embodiments of the present invention may be used as the reception filter.

Since the ladder filter 21 is used for the transmission filter in the present preferred embodiment, outstanding impedance matching is achieved in the transmission filter and the insertion loss is reduced.

The ladder filter 21 has attenuation-frequency characteristics similar to the attenuation-frequency characteristics illustrated in FIG. 4. An attenuation pole is generated around 790 MHz because the ladder filter 21 includes the third parallel arm resonator P4. This increases the attenuation in the pass band of the reception filter. Accordingly, outstanding isolation characteristics are achieved. A BAW resonator may preferably be used for at least a portion of the serial arm resonators and the parallel arm resonators in the ladder filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter that has a certain pass band comprising:
    at least one serial arm resonator and first and second parallel arm resonators; wherein
    a resonant frequency of the at least one serial arm resonator and anti-resonant frequencies of the first and second parallel arm resonators are positioned in the certain pass band;
    the anti-resonant frequency of the first parallel arm resonator is positioned at a high frequency side of the anti-resonant frequency of the second parallel arm resonator; and
    the ladder filter further includes a third parallel arm resonator that is connected in parallel to the first parallel arm resonator, that has an electrostatic capacitance smaller than that of the first parallel arm resonator, and that has an anti-resonant frequency positioned outside the certain pass band.

2. The ladder filter according to claim 1, wherein the anti-resonant frequency of the first parallel arm resonator is positioned at a high frequency side of the resonant frequency of the at least one serial arm resonator directly connected to the first parallel arm resonator without any serial arm resonator interposed therebetween.

3. The ladder filter according to claim 1, wherein
    the second parallel arm resonator includes a plurality of second parallel arm resonators and the ladder filter includes an input end and an output end; and
    among the first to third parallel arm resonators, two parallel arm resonators in the plurality of second parallel arm resonators are the parallel arm resonator positioned closest to the input end and the parallel arm resonator positioned closest to the output end.

4. The ladder filter according to claim 3, wherein
    the at least one serial arm resonator includes first, second, third, and fourth serial arm resonators connected in this order from the input end to the output end;
    the first parallel arm resonator and the third parallel arm resonator are connected in parallel to each other between nodes between the second serial arm resonator and the third serial arm resonator and a ground potential;
    one of the plurality of second parallel arm resonators is connected between a node between the first serial arm resonator and the second serial arm resonator and the ground potential; and
    another one of the plurality of second parallel arm resonators is connected between a node between the third serial arm resonator and the fourth serial arm resonator and the ground potential.

5. The ladder filter according to claim 4, wherein each of the first, second, third, and fourth serial arm resonators are each defined by a surface acoustic wave resonator including an interdigital transducer electrode provided on a piezoelectric substrate.

6. The ladder filter according to claim 4, wherein each of the first, second, and third parallel arm resonators are defined by a surface acoustic wave resonator including an interdigital transducer electrode provided on a piezoelectric substrate.

7. The ladder filter according to claim 4, wherein a ground potential side of the first parallel arm resonator, the second parallel arm resonator, and the third parallel arm resonator are commonly connected to each other.

8. The ladder filter according to claim 7, wherein an inductor is interposed between the ground potential and the first parallel arm resonator, the second parallel arm resonator, and the third parallel arm resonator.

9. The ladder filter according to claim 4, wherein the first parallel arm resonator, the second parallel arm resonator, and the third parallel arm resonator are separately connected to a ground potential.

10. The ladder filter according to claim 1, wherein the electrostatic capacitance of the third parallel arm resonator is smaller than electrostatic capacitances of the first and second parallel arm resonators.

11. The ladder filter according to claim 1, wherein the anti-resonant frequency of the third parallel arm resonator is positioned at a high frequency side of the pass band, which is defined by the serial arm resonator and the first and second parallel arm resonators.

12. The ladder filter according to claim 1, wherein the anti-resonant frequency of the third parallel arm resonator is positioned at a low frequency side of the pass band, which is defined by the serial arm resonator and the first and second parallel arm resonators.

13. The ladder filter according to claim 1, wherein
    the first, second and third parallel arm resonators are each defined by a surface acoustic wave resonator; and
    the electrostatic capacitance of the third parallel arm resonator is smaller than the electrostatic capacitances of the first and second parallel arm resonators and a duty ratio of the third parallel arm resonator is higher than duty ratios of the first and second parallel arm resonators.

14. A duplexer comprising the ladder filter according to claim 1.

15. The duplexer according to claim 14, wherein the ladder filter is a transmission filter.

16. The duplexer according to claim 14, further comprising:
    a reception filter including a resonator, a first longitudinally coupled resonator elastic wave filter, and a second longitudinally coupled resonator elastic wave filter connected in series with one another.

* * * * *